(12) United States Patent
Cismas

(10) Patent No.: US 6,889,310 B2
(45) Date of Patent: May 3, 2005

(54) MULTITHREADED DATA/CONTEXT FLOW PROCESSING ARCHITECTURE

(75) Inventor: Sorin C. Cismas, Saratoga, CA (US)

(73) Assignee: Mobilygen Corporation, Santa Clara, CA (US)

(*) Notice: Subject to any disclaimer, the term of this patent is extended or adjusted under 35 U.S.C. 154(b) by 487 days.

(21) Appl. No.: 09/927,625

(22) Filed: Aug. 9, 2001

(65) Prior Publication Data

US 2002/0069393 A1 Jun. 6, 2002

Related U.S. Application Data

(60) Provisional application No. 60/224,770, filed on Aug. 12, 2000.

(51) Int. Cl.$^7$ .............................................. G06F 13/00
(52) U.S. Cl. ........................ 712/201; 712/220; 710/110
(58) Field of Search ................................. 712/201, 200, 712/206, 220, 32, 33, 225; 710/110, 305

(56) References Cited

U.S. PATENT DOCUMENTS

| | | | | |
|---|---|---|---|---|
| 4,135,241 A | * | 1/1979 | Stanis et al. ................. | 705/28 |
| 5,353,418 A | | 10/1994 | Nikhil et al. | |
| 5,420,989 A | * | 5/1995 | Maher et al. ............... | 710/110 |
| 5,560,029 A | | 9/1996 | Papadopoulos et al. | |
| 5,907,691 A | * | 5/1999 | Faget et al. .................. | 710/305 |
| 6,061,710 A | | 5/2000 | Eickemeyer et al. | |
| 6,145,073 A | | 11/2000 | Cismas | |

OTHER PUBLICATIONS

U.S. Appl. No. 60/224,770.*

* cited by examiner

Primary Examiner—Henry W. H. Tsai
(74) Attorney, Agent, or Firm—Andrei D. Popovici

(57) ABSTRACT

Multithreaded data- and context-flow processing is achieved by flowing data and context (thread) identification tokens through specialized cores (functional blocks, intellectual property). Each context identification token defines the identity of a context and associated context parameters affecting the processing of the data tokens. Parameter values for different contexts are stored in a distributed manner throughout the cores. Upon a context switch, only the identity of the new context is propagated. The parameter values for the new context are retrieved from the distributed storage locations. Different cores of the system and different pipestages within a core can work simultaneously in different contexts. The described architecture does not require long propagation distances for parameters upon context switches, or that an entire pipeline finish processing in one context before starting processing in another. The system can be effectively controlled by the flow of data and context identification tokens therethrough.

29 Claims, 5 Drawing Sheets

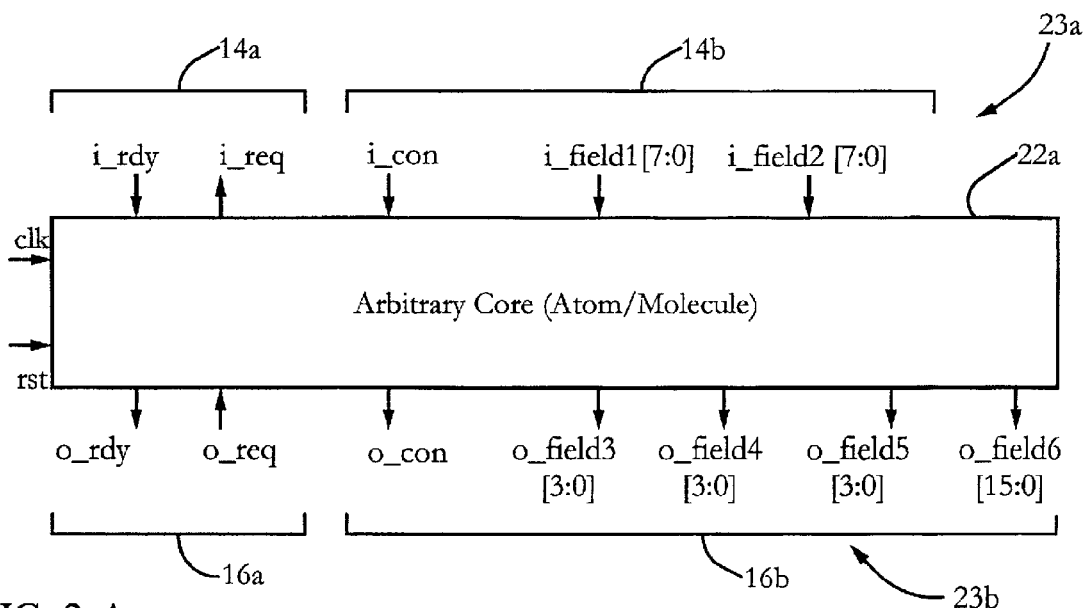
FIG. 2-A
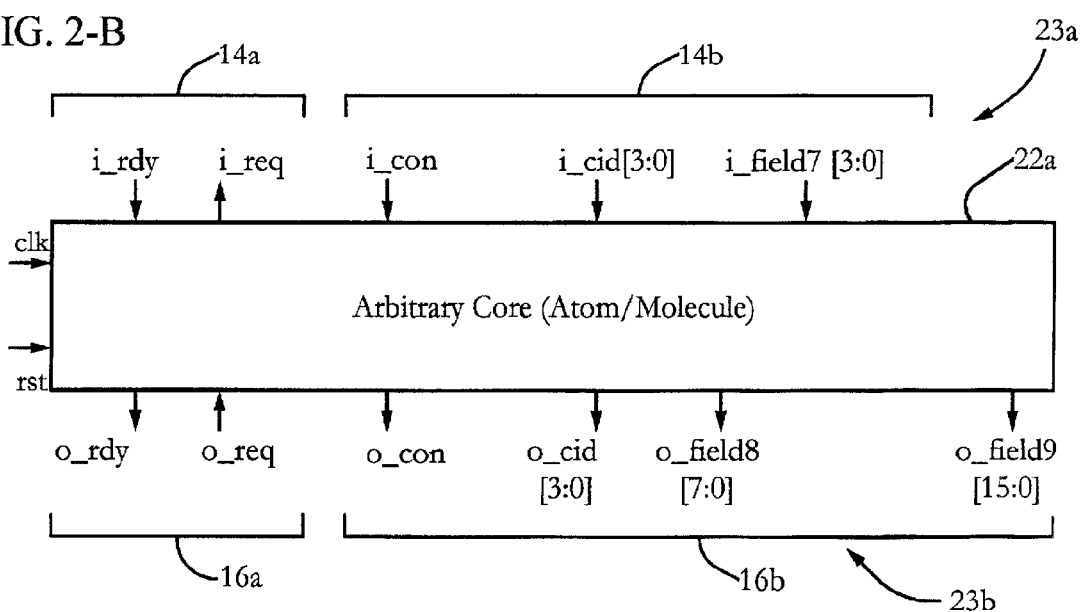
FIG. 2-B

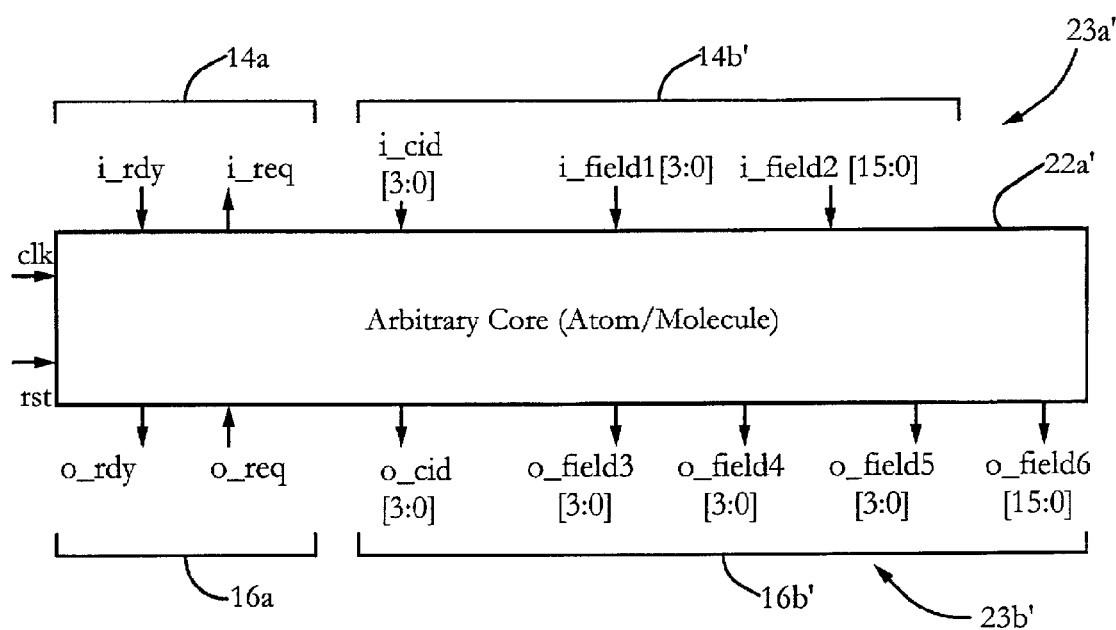
FIG. 2-C

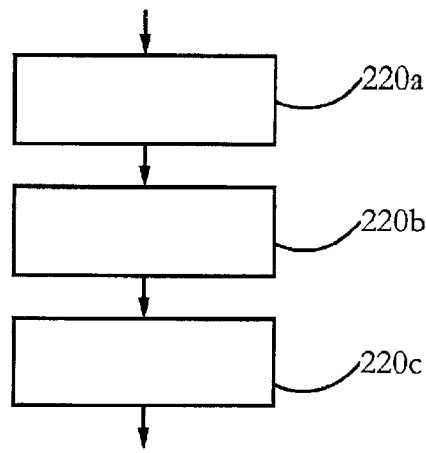
FIG. 6-A
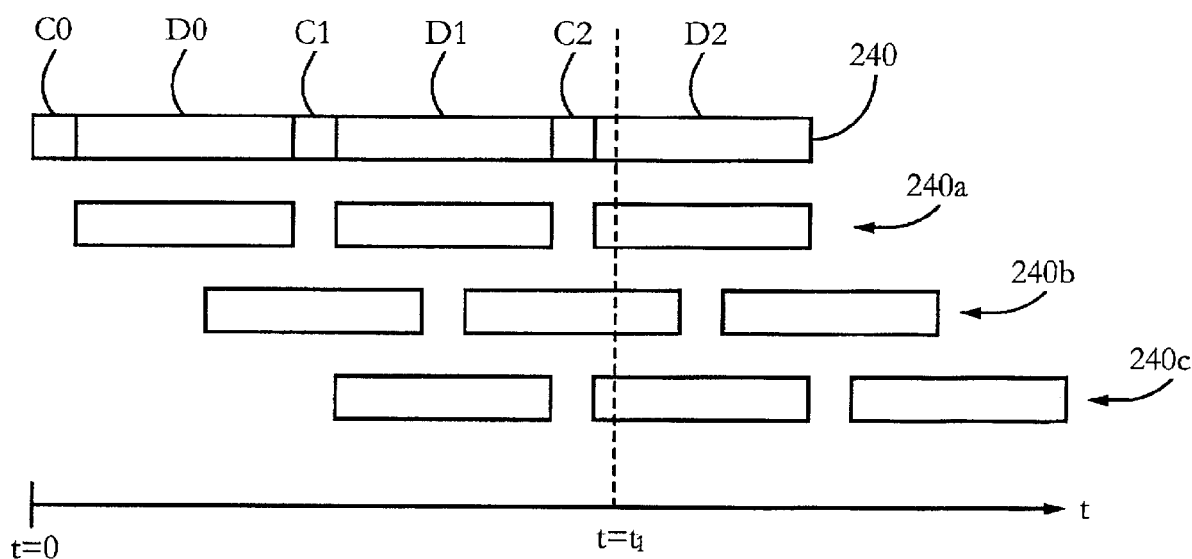
FIG. 6-B

MULTITHREADED DATA/CONTEXT FLOW PROCESSING ARCHITECTURE

RELATED APPLICATION DATA

This application claims the priority date of U.S. Provisional Patent Application No. 60/224,770, filed Aug. 12, 2000, entitled "Multithreaded Data Flow Processing," herein incorporated by reference. This application is related to U.S. patent application Ser. No. 09/634,131, filed Aug. 8, 2000, entitled "Automated Code Generation for Integrated Circuit Design," herein incorporated by reference.

TRADEMARK NOTICE

QuArc, QDL, and Data Driven Processing are trademarks or registered trademarks of Mobilygen Corporation. Verilog is a registered trademark of Cadence Design Systems, Inc. Synopsys is a registered trademark of Synopsys, Inc. Other products and services are trademarks of their respective owners.

BACKGROUND OF THE INVENTION

This invention relates to integrated circuits (ICs) and data processing systems and their design, in particular to integrated circuit devices having a modular data-flow (data-driven) architecture.

Continuing advances in semiconductor technology have made possible the integration of increasingly complex functionality on a single chip. Single large chips are now capable of performing the functions of entire multi-chip systems of a few years ago. While providing new opportunities, multimillion-gate systems-on-chip pose new challenges to the system designer. In particular, conventional design and verification methodologies are often unacceptably time-consuming for large systems-on-chip.

Hardware design reuse has been proposed as an approach to addressing the challenges of designing large systems. In this approach, functional blocks (also referred to as cores or intellectual property, IP) are pre-designed and tested for reuse in multiple systems. The system designer then integrates multiple such functional blocks to generate a desired system. The cores are often connected to a common bus, and are controlled by a central microcontroller or CPU.

The hardware design reuse approach reduces the redundant re-designing of commonly-used cores for multiple applications. At the same time, the task of interconnecting the cores often makes the system integration relatively difficult. Such integration is particularly difficult for cores having complex and/or core-specific interfaces. Core integration is one of the major challenges in designing large systems integrated on a single chip using the hardware design reuse approach.

U.S. Pat. No. 6,145,073, "Data Flow Integrated Circuit Architecture," herein incorporated by reference, provides an architecture and design methodology allowing relatively fast and robust design of large systems-on-chip. The described systems are optimized for working in a single context at a time.

SUMMARY OF THE INVENTION

The present invention provides systems and methods for multithreaded data-flow and context-flow processing. Data tokens and context (thread) identification tokens flow through specialized cores (functional blocks, intellectual property). The context identification tokens select a set of processing parameters affecting the processing of the data tokens. Context parameter values are stored in a distributed manner throughout the cores, in order to reduce the propagation distances for the parameter values upon context switches. Upon a context switch, only the identity of the new context is propagated. The parameter values for the new context are retrieved from the distributed storage locations. Different cores and different context-dependent pipestages within a core can work in different contexts at the same time.

BRIEF DESCRIPTION OF THE DRAWINGS

The foregoing aspects and advantages of the present invention will become better understood upon reading the following detailed description and upon reference to the drawings where:

FIG. 2-A illustrates the interface fields of an exemplary core for a data token, according to the preferred embodiment of the present invention.

FIG. 2-B shows the interface fields of the core of FIG. 2-A for a context identification token, according to the preferred embodiment of the present invention.

FIG. 2-C illustrates the interface fields of an exemplary core for a data token and associated context identification token, according to an alternative embodiment of the present invention.

FIG. 6-A illustrates an exemplary arrangement of three pipestages connected in series according to the present invention.

FIG. 6-B illustrates the processing performed by the cores of FIG. 6-A for three consecutive data token streams corresponding to different contexts, according to the present invention.

DETAILED DESCRIPTION OF THE INVENTION

Figure 1:
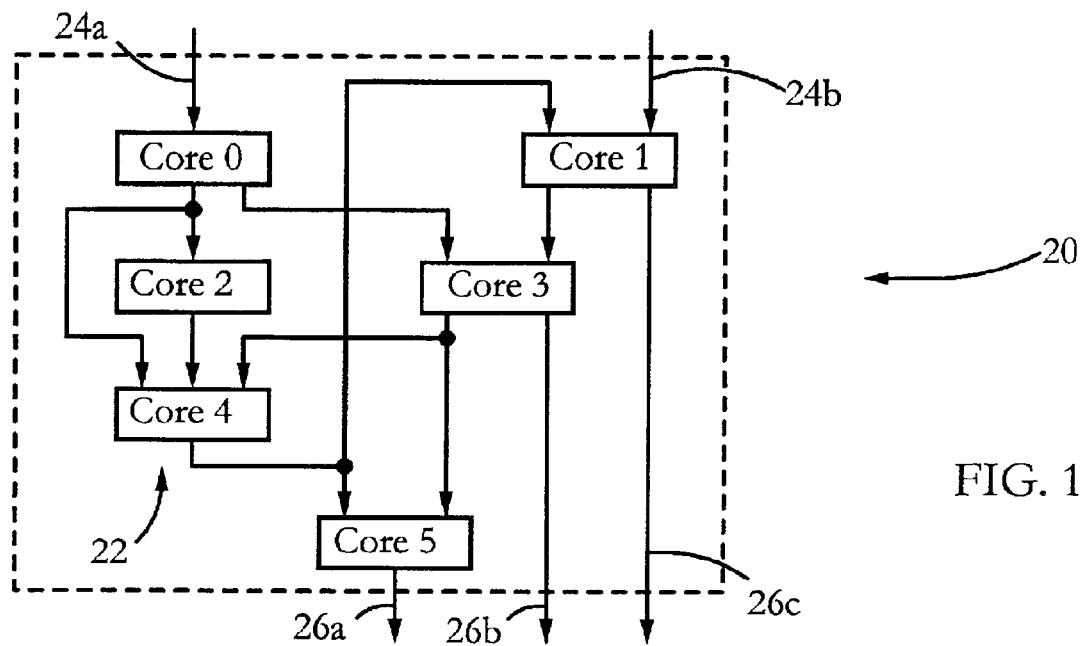
FIG. 1 is a diagram of an exemplary integrated circuit system comprising a plurality of interconnected cores, according to the preferred embodiment of the present invention.

In the following description, a pipestage is understood to be a circuit which includes a finite state machine (FSM). A core is understood to be a circuit including plural interconnected pipestages. The statement that a first token is derived from a second token is understood to mean that the first token is either equal to the second token or is generated by processing the second token and possibly other tokens. In general, the recitation of a first token and a second token is understood to encompass a first token identical to the second token (i.e. the two tokens need not necessarily be different). The statement that two signals are asserted with a predetermined synchronous relationship is understood to mean that the first signal is asserted a predetermined number of clock cycles before the second signal, or that the two signals are asserted synchronously, wherein the predetermined number of clock cycles is fixed for a given interface. The statement that two signals are asserted synchronously is understood to mean that both signals are asserted (i.e. are on) simultaneously with respect to a clock event such as the rising or falling edge of a waveform on a clock signal. The statement that a token is transferred synchronously with a first signal and a second signal is understood to mean that the token transfer occurs on the same clock cycle as the synchronous assertion of the first and second signals. A set of elements is understood to contain one or more elements. Any reference to an element is understood to encompass one or more elements. Unless explicitly stated otherwise, the term "bus" is understood to encompass single-wire connections as well as multi-bit connections.

The following description illustrates embodiments of the invention by way of example and not necessarily by way of limitation.

In the preferred architectural approach of the present invention, an algorithm (e.g. the MPEG decompression process) is decomposed in several component processing steps. A data-driven core (intellectual property, functional block, object) is then designed to implement each desired step. Each core is optimized to perform efficiently a given function, using a minimal number of logic gates. Once designed, a core can be re-used in different integrated circuits.

Preferably, the system is capable of multithreaded (multi-context) operation, as described below. The system is capable of seamlessly switching between different threads or contexts. For example, for an MPEG decoder capable of picture-in-picture operation, the system is capable of switching between decoding a main picture and a secondary picture. Similarly, for systems used in a wireless communication device, the system is capable of seamlessly switching between various applications such as voice and data decoding applications.

A given context corresponds to a plurality of parameters used in processing a data stream. For example, for an MPEG decoder, a context may include a plurality of syntax elements such as picture header, sequence header, quantization tables, and memory addresses of reference frames.

FIG. 1 shows a diagram of an exemplary integrated circuit device 20 according to the preferred embodiment of the present invention. Device 20 may be part of a larger system integrated on a single chip. Device 20 may also form essentially the entire circuit of a chip. Device 20 has a data- and context-flow architecture, in which operations are controlled by the flow of data and context tokens through the device.

Device 20 comprises a plurality of interconnected data-driven cores (functional blocks, intellectual property) 22 integrated on the chip. Each of cores 22 is of at least a finite-state machine complexity. Each of cores 22 may typically have anywhere from hundreds to millions of gates, with common cores having thousands to tens of thousands of gates. Examples of suitable cores include digital signal processing (DSP) modules, discrete cosine or inverse cosine transform (DCT, IDCT) modules, arithmetic logic units (ALU), central processing units (CPUs), bit stream parsers, and memory controllers. Preferably, each of cores 22 performs a specialized predetermined function which depends on a context within each core 22.

The operation of cores 22 is driven by the flow of data and context (context identification) tokens therethrough. Cores 22 are connected to on- or off-chip electronics through plural input interfaces 24a–b and output interfaces 26a–c. Some of cores 22 can have plural inputs (e.g. cores 1, 3, 4, 5), some can have plural outputs (e.g. cores 0, 1, 3), while some can have a single input and a single output (e.g. core 2). Some outputs may be connected to the input of plural cores, as illustrated by the connection of the output of core 4 to inputs of cores 1 and 5. The core arrangement in FIG. 1 is shown for illustrative purposes only, in order to illustrate the flexibility and versatility of the preferred architecture of the present invention. Various other arrangements can be used for implementing desired functions.

Cores 22 are interconnected through dedicated standard interfaces of the present invention, as described in more detail below. Preferably substantially all of the inter-core interfaces of device 20 are such standard interfaces. Each interface is fully synchronous and registered. There are no combinational paths from any core input to any core output. Each core 22 has a clock connection and a reset connection for receiving external clock (clk) and reset (rst) signals, respectively.

FIGS. 2-A and 2-B illustrate an exemplary core 22a and its interfaces to two other cores. Core 22a has an input interface 23a connected to one of the two cores, and an output interface 23b connected to the other of the two cores. Core 22a receives tokens over input interface 23a, and transmits tokens over output interface 23b. The core connected to input interface 23a will be termed an input core, and the core connected to output interface 23b will be termed an output core. FIGS. 2-A and 2-B illustrates only one input and one output interface for simplicity. A given core may include multiple input and/or output interfaces.

Input interface 23a includes an input control bus (signal) 14a and an input token bus 14b. Similarly, output interface 23b includes an output control bus (signal) 16a and an output token bus 16b. Each token bus 14b, 16b can carry, at different times, both data and context identification (context) tokens, as explained in further detail below. Context identification tokens are preferably carried sequentially relative to data tokens, rather than simultaneously. The control bus carries control signals regulating the transmission of tokens over the token bus.

Each control bus 14a, 16b includes a pair of ready/request control connections for each transmitter-receiver core pair. Each request and ready connection is preferably a unidirectional one-bit connection, and is dedicated to a given transmitter-receiver core pair. Input control bus 14a includes an input request connection for asserting an input request signal i_req, and an input ready connection for receiving a corresponding input ready signal i_rdy. Output control bus 16b includes an output ready connection for asserting an output ready signal o_rdy, and an output request connection for receiving an output request signal o_req. Core 22a asserts input request signal i_req only if core 22a is ready to accept a corresponding input token. Similarly, core 22a asserts output ready signal o_rdy only if it is ready to transmit a corresponding output token.

An acknowledge condition ack is defined as being met when both signals req and rdy of a given control connection pair are asserted with a predetermined synchronous relationship. That is, ack is met when the number of clock cycles elapsed between the assertions of the req and rdy signals is equal to some integer (e.g. one or two) which is predetermined (fixed) for a given interface. For example, if the integer is one, ack may be met upon assertion of req one clock cycle after assertion of rdy. The integer is preferably zero, i.e. ack is met when req and rdy are asserted synchronously.

A token is transferred over a token bus only if an acknowledge condition ack is met for the control connection pair corresponding to the data connection. The token transfer preferably occurs synchronously with the meeting of ack, but may also occur a predetermined integer number (e.g. one or two) of clock cycles after ack is met. Transferring tokens synchronously with assertion of corresponding req and rdy signals provides for reduced data transfer times and relatively simple control logic as compared to a similar interface requiring a predetermined clock cycle delay between the assertions of req and rdy, or between ack and token transfer.

Simultaneous assertion of rdy and req signals on a clock cycle as described above is preferably necessary and sufficient for effecting token transfer on the same clock cycle. No other signals are required for establishing, maintaining, or terminating token transfer. Any core 22 can stall the transfer of tokens to and from itself on any given clock cycle. For further information on the presently preferred core interconnection protocols and design methodology, see the above-incorporated U.S. Pat. No. 6,145,073.

Each token bus 14b, 16b is preferably a unidirectional multiple-bit connection. The wires of each token bus are preferably grouped logically in units called fields. FIGS. 2-A and 2-B show the component fields and field bit-ranges (widths) for the token buses 14b, 16b. The default bit range is zero, as illustrated by the i_con field. Exemplary bit ranges for the different fields are shown in square brackets. For example, the notation [15:0] following the field name o_field6 indicates that the field o_field6 is 16-bit wide.

Each token bus includes a dedicated content-specification (data/context or content indicator flag) field which specifies whether a token passing through the token bus is a data token or a context token. The content specification field carries a content flag, which can be for example 0 for data tokens and 1 for context tokens. Depending on the value of the content specification flag, the other fields can include bitstream data such as a red color value for a pixel, or context identities such as a number between 0 and 3. In general, the content specification field can include more than one bit.

FIG. 2-A illustrates exemplary fields of token buses 14b, 16b corresponding to content specification flags i_con and o_con values indicating that the tokens passing through token buses 14b, 16b are data tokens. As shown, input token bus 14b includes two 8-bit-wide fields, i_field1 and i_field2, while output token bus 16b includes three 4-bit-wide fields, o_field3, o_field4, and o_field5, and a 16-bit-wide field o_field6. The illustrated fields are shown as examples—token buses can have various fields and field widths.

FIG. 2-B illustrates exemplary fields of token buses 14b, 16b corresponding to content specification flags i_con and o_con values indicating that the tokens passing through token buses 14b, 16b are context identification tokens. Input token bus 14b then includes a 4-bit-wide context identification field i_cid, while output token bus 16b includes a corresponding 4-bit-wide context identification field o_cid. Each context identification field is capable of transmitting a context identification token which identifies one of sixteen contexts to which subsequent data tokens belong. Token buses 14b, 16b can include other fields in the configuration shown in FIG. 2-B, such as fields i_field7, o_field8, and o_field9. Such fields can carry, for example, a command that changes the way data tokens are processed.

The operation of core 22a according to the preferred embodiment of the present invention will now be described with reference to FIGS. 2-A and 2-B. Consider the data transfer configuration illustrated in FIG. 2-A, which corresponds to the passage of data tokens through interfaces 23a–b. An input acknowledge (iack) condition on input interface 23a is met upon the assertion of i_rdy and i_req signals on the same clock cycle. A data token/tokens is/are then received on that clock cycle over fields i_field1 and i_field2. The value of content specification flag i_con (e.g. zero) indicates that the received token is a data token, rather than a context identification token.

Data processing logic within core 22a then processes the received data token using internally stored context parameter values and/or data tokens received over other input interfaces (not shown). An output acknowledge (oack) condition on output interface 23b is met upon the assertion of o_rdy and o_req signals on the same clock cycle. A data token/tokens is/are then transmitted on that clock cycle over fields o_field3–6. The value of the content specification flag o_con (e.g. zero) indicates that the transmitted token is a data token.

Consider now the context-switch configuration illustrated in FIG. 2-B, which corresponds to the passage of context identification (context switch) tokens through interfaces 23a–b. If an input acknowledge (iack) condition is met on input interface 23a, core 22a receives a context identification token i_cid. The value of the content specification flag i_con (i.e. one) indicates that the received token is a context identification token.

The context identification token then propagates through core 22a as explained in further detail below. The context identification token follows the previously received data tokens through core 22a. Once an output acknowledge (oack) condition is met on output interface 23b, core 22a transmits a context identification token o_cid. The value of o_cid is equal to that of i_cid. The value of the content specifion flag o_con indicates that the transmitted token is a context identification token.

FIG. 2-C illustrates an exemplary core 22a' according to an alternative embodiment of the present invention. A token bus 14b' of an input interface 23a' includes a dedicated 4-bit-wide context identification field i_cid, and data token fields i_field1–2. Similarly, a token bus 16b' of an output interface 23b' includes a dedicated 4-bit-wide context identification field o_cid, and data token fields o_field3–6. In the illustrated embodiment, each token received over input interface 14b' includes a context identification part i_cid, and a data part corresponding to fields i_field1–2. Similarly, each token transmitted over output interface 16b' includes a context identification part o_cid, and a data part corresponding to fields o_field3–6. Effectively, each token passing through core 22a' includes a context identification label for identifying the context of that token. The embodiment shown in FIG. 2-C requires a higher overhead of dedicated interface wires than the embodiment shown in FIGS. 2-A and 2-B, since each data token now includes a 4-bit context-identifier, rather than merely a 1-bit content specification flag. At the same time, in the embodiment shown in FIG. 2-C, context switching does not require a separate cycle for transmitting a special context-identification token. Data tokens corresponding to different contexts can now be received/transmitted on consecutive cycles.

Figure 3:
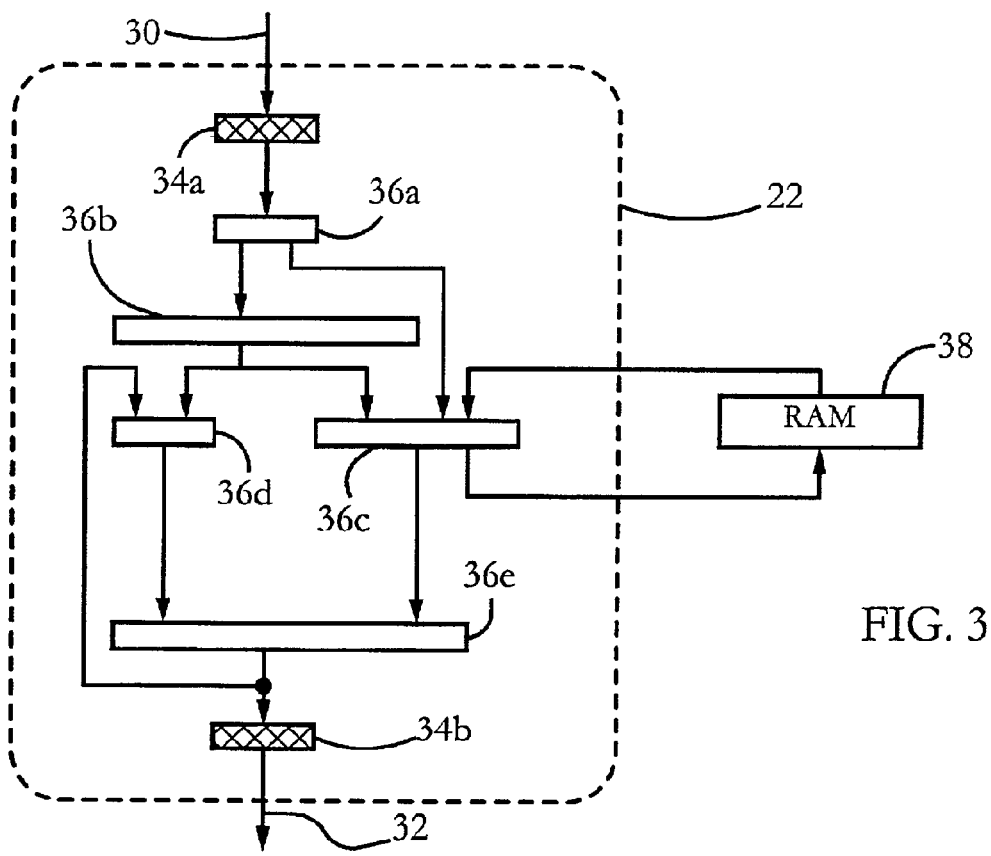
FIG. 3 is a diagram showing the internal pipestages of an exemplary core, according to the preferred embodiment of the present invention.

FIG. 3 illustrates the internal structure of an exemplary core 22 of the present invention. Core 22 is connected to other on-chip cores or off-chip electronics through an input interface 30 and an output interface 32. Core 22 may also be connected to on-chip or off-chip components such as a random access memory (RAM) 38. Core 22 comprises a plurality of interconnected pipestages, including core interface pipestages 34a–b, and internal pipestages 36a–e. Some, but not necessarily all, of internal pipestages 36a–e may effect context-dependent processing. Most pipestages are preferably interconnected according to the rdy/req protocol described above, although some pipestages may be interconnected according to other protocols.

Each pipestage of core 22 is of at least finite-state-machine (FSM) complexity. Finite state machines include combinational logic (CLC) and at least one register for holding a circuit state. Finite state machines can be classified into two broad categories: Moore and Mealy. A Mealy FSM may have combinational paths from input to output, while a Moore FSM does not have any combinational paths from input to output. The output of a Mealy FSM for a given clock cycle depends both on the input(s) for that clock cycle and its state. The output of a Moore FSM depends only on its state for that clock cycle.

Core interface pipestages 34a–b are preferably Moore FSMs. Consequently, there are no combinational paths through a core, and the output of a core for a given clock cycle does not depend on the core input for that clock cycle. The absence of combinational paths through the cores eases the integration and reusability of the cores into different devices, and greatly simplifies the simulation and verification of the final device.

Internal pipestages 36a–e can be Mealy or Moore FSMs. For a core including Mealy FSM internal pipestages, there may be some combinational paths through the internal pipestages. Combinational paths are acceptable within cores 22, since each of cores is generally smaller than device 20 and thus relatively easy to simulate and verify, and since the internal functioning of cores 22 is not generally relevant to the system integrator building a system from pre-designed cores. Combinational paths through internal pipestages can even be desirable in some circumstances, if such combinational paths lead to a reduction in the processing latency or core size required to implement a desired function.

Figure 4:
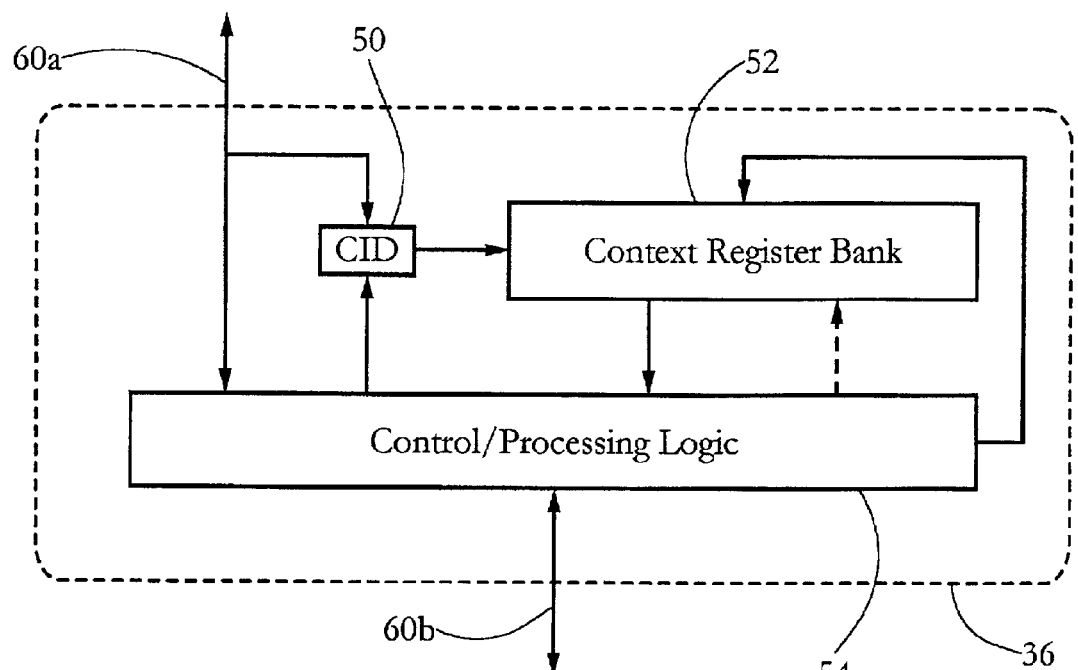
FIG. 4 schematically shows the internal structure of a pipestage capable of context-dependent processing, according to the preferred embodiment of the present invention.

FIG. 4 shows an arbitrary context-dependent internal pipestage 36 according to the preferred embodiment of the present invention. Pipestage 36 includes a context-identification (CID) register 50, a context storage/memory unit such as a context register bank (CRB) 52, and control/processing logic 54. Context register bank 52 includes a plurality of registers, each storing all context parameter values needed by control/processing logic 54 to perform processing in one context. Control/processing logic 54 includes interconnected registers and combinational logic circuits (CLCs).

Context identification register 50 is connected to an input interface 60a, for storing context identification tokens received through input interface 60a. Context identification register 50 is also connected to context register bank 52, for setting context register bank 52 to a current context corresponding to the context identification token stored in register 50. Control/processing logic 54 is also connected to register 50, for controlling register 50 to store a token only if the corresponding content specification flag (i_con in FIG. 2-A) indicates that the token is a context identification token.

Context register bank 52 is connected to control/processing logic 54, for providing context parameters for the current context to control/processing logic 54, and for accepting updated context parameters for the current context from control/processing logic. Control/processing logic 54 is connected to input interface 60a and an output interface 60b, for receiving and transmitting data and context identification tokens when corresponding ack conditions are met on interfaces 60a–b. Control/processing logic 54 also generates input request and output ready (i_req and o_rdy) signals, and receives input ready and output request (i_rdy and o_req) signals, for controlling the transfer of tokens over interfaces 60a–b.

The preferred mode of operation of pipestage 36 will now be described with reference to FIG. 4. When an ack condition is met for input interface 60a, pipestage 36 receives a corresponding input token. The first token received by pipestage 36 at start-up is a context-identification token, identifying the current context for pipestage 36. Subsequent tokens can be data tokens or context identification tokens.

If the content specification field of a received token indicates that the token is a data token, the token received and processed by control/processing logic 54. The content of context identification register 50 remains unchanged. The data token is processed by combinational logic within control/processing logic 54. The resulting data token is then made available for transfer over output interface 60b. When an ack condition is met over output interface 60b, the resulting output data token is transmitted over output interface 60b. If the processing performed by control/processing logic 54 generates an update to a current context parameter, the updated context parameter is loaded from control/processing logic 54 into a corresponding register within context register bank 52.

If the content specification field of a received token indicates that the token is a context identification token, control/processing logic 54 directs context identification register 50 to load a new context identification token received over a context identification field of input interface 60a. The new context identification token stored in context identification register 50 sets the current context within context register bank 52 to the new context. Control/processing logic 54 then controls the transfer of the context identification token over interface 60b. Subsequent received data tokens are treated as described above.

Figure 5:
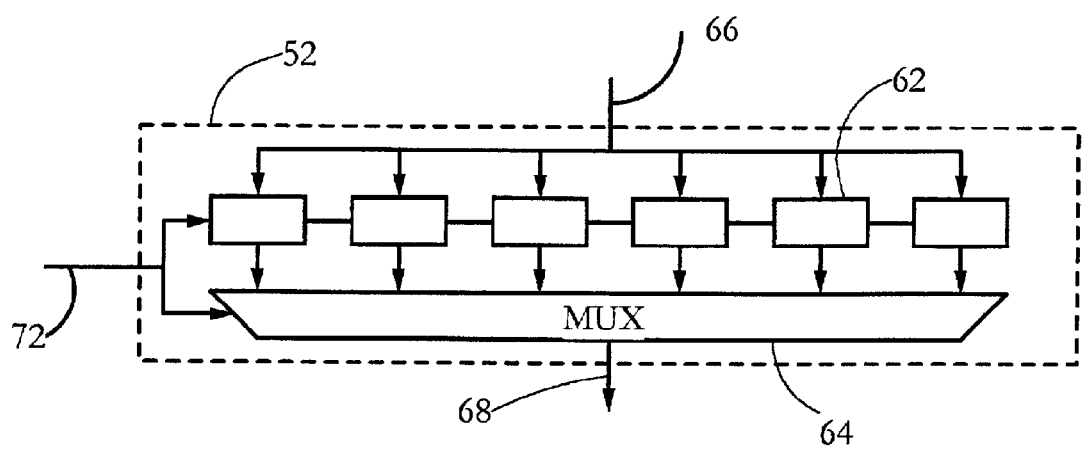
FIG. 5 shows a context register bank (multi-context parameter storage unit), according to the preferred embodiment of the present invention.

FIG. 5 shows the internal structure of context register bank (CRB) 52 according to the preferred embodiment of the present invention. CRB 52 includes a plurality of identical context parameter registers 62 connected in parallel, and a multiplexer 64 connected to the outputs of registers 62. Each register 62 stores all context parameter values required by control/processing logic 54 in one context. Each register 62 can have multiple fields. The number of registers 62 is equal to the maximum number of contexts that pipestage 36 is capable of switching between.

The inputs of registers 62 are commonly connected to control/processing logic 54 over a common input token connection 66. Input token connection 66 includes a data connection and an update (load-enable) connection (signal). The outputs of registers 62 are connected to corresponding multiple inputs of multiplexer 64. The output 68 of multiplexer 64 forms the output of CRB 52. The select line of multiplexer 64 and the load enable lines of registers 62 are commonly connected to the output of context identification register 50 over a context control connection 72.

Control connection 72 effectively selects the one register 62 corresponding to the current context identified by the value stored in context identification register 50. The data in that register 62 is made available to control/processing logic 54 through multiplexer 64. Moreover, the load enable line of that one register 62 is selectively activated, such that only that register 62 loads updated context parameter values generated by control/processing logic 54.

CRB 52 allows locally storing within pipestage 36 all context parameters required for processing by control/ processing logic 54 in multiple contexts. Such context parameters can include, as exemplified above, relatively large amounts of information such as quantization tables. Such context parameters typically include significantly more data than the context identification tokens that identify the contexts.

Generally, a multi-context memory unit such as a random access memory can be used instead of a context register bank for storing context parameter values for multiple contexts. Such a memory unit would be particularly useful for storing relatively large context parameters such as quantization tables. The context identification token sent to the memory can then form part of the memory address to be accessed. Another part of the memory address can be generated by logic 54, and can specify for example the identity of a specific parameter requested by logic 54. In such an implementation, an additional connection between logic 54 and the memory unit can be employed, as illustrated by the dotted arrow in FIG. 4.

Referring to FIG. 3, it will be apparent to the skilled artisan that the values of the context parameters for all possible contexts are distributed within multiple context-dependent pipestages of core 22. Thus, when a context switch is to be effected, it is not required to propagate the relatively large amounts of data contained in the context parameters for the new context. Only the identity of the new context is propagated within core 22, rather than all the parameter values corresponding to the new context.

Some pipestages 36 may perform context-independent operations on received data tokens. Such pipestages need not contain a context register bank for storing context parameters, but such pipestages can be capable of passing context identification tokens therethrough.

FIGS. 6-A and 6-B illustrate schematically the operation of an integrated circuit according to the preferred embodiment of the present invention. For simplicity, FIG. 6-A illustrates three pipestages 220a–c connected in series such that data tokens flow sequentially from pipestage 220a to pipestage 220c. FIG. 6-B shows a token sequence 240 entering pipestage 220a, and three processing sequences 240a–c illustrating the periods during which pipestages 220a–c process the tokens of sequence 240b, respectively.

Sequence 240 comprises a context token C0 followed in order by a data token sequence (stream) D0 corresponding to token C0, a context token C1, a data token sequence D1 corresponding to token C1, a context token C2, and a data token sequence D2 corresponding to token C2.

Pipestage 220a receives context token C0 at an initial time t=0. Pipestages 220a–c then starts processing token sequence D0 within a first context defined by context token C0, as illustrated by the first periods of processing sequences 240a–c. When pipestage 220a receives context token C1, pipestage 220a starts processing token sequence D0 within a second context defined by context token C1. At this time, pipestages 220b–c continue processing token sequence D0 within the context corresponding to token C0, until context token C1 propagates to each pipestage 220b–c. The above-described process continues for context token C2. At a given time t=$t_1$, different pipestages 220a–c can be processing data tokens within different contexts. As illustrated, the arrangement described above allows a minimization in the amount of dead processing time required for switching contexts.

Due to the distributed storage of context parameters for multiple contexts, each core can start processing within a new context immediately after the identity of the new context becomes available. The core need not wait for the propagation of large amounts of context parameter data.

Systems according to the above-description can be designed using known design tools. In particular, the above-incorporated U.S. patent application Ser. No. 09/634,131, filed Aug. 8, 2000, entitled "Automated Code Generation for Integrated Circuit Design," describes a presently preferred design methodology and systems suitable for implementing systems of the present invention.

It will be clear to one skilled in the art that the above embodiments may be altered in many ways without departing from the scope of the invention. For example, each pipestage need not contain data processing logic. In a pipestage without input data processing logic, internal tokens stored in token registers may be equal to input tokens received by the pipestage. Similarly, in a pipestage without output data processing logic, output tokens transmitted by the pipestage may be equal to internal tokens stored in token registers. Context-independent cores and pipestages need not store context parameter data. Furthermore, pipestages need not store context parameters not affecting their functions. Context switching can be implemented at various hierarchical levels, for example at the picture boundary or slice boundary levels for an MPEG decoder. Accordingly, the scope of the invention should be determined by the following claims and their legal equivalents.

What is claimed is:

1. A data-flow and context-flow data processing system comprising a plurality of data driven cores capable of switching between a plurality of contexts, wherein the plurality of data driven cores comprises a plurality of distributed multi-context storage units each capable of storing a plurality of context parameters corresponding to the plurality of contexts, each multi-context storage unit comprising:

a) a context register bank comprising
   a plurality of context parameter registers for storing the plurality of context parameters, each context parameter register storing a parameter for one of the contexts, the plurality of context parameter registers having a corresponding plurality of inputs connected to an input connection, and a corresponding plurality of outputs; and
   a multiplexer having a plurality of multiplexer inputs each connected to a corresponding one of the plurality of context parameter register outputs, for selecting a current context parameter set for transmission to a multiplexer output;

b) a context identification register connected to the context register bank, for storing a current context identification token identifying a current context for the context register bank, wherein
   the context identification register is connected to a select line of the multiplexer, for controlling the multiplexer to select the current context parameter set for transmission; and
   the context identification register is connected to a load enable line of each of the context parameter registers, for enabling an updating of a current context parameter set in a corresponding context parameter register; and c) logic connected to the multiplexer output for receiving the current context parameter set and processing a set of data tokens according to the current context parameter set, connected to the input connection of the context parameter registers for providing updated context parameter sets to the context parameter registers, and connected to the context identification register for propagating the current context identification token through the multi-context storage unit.

2. The system of claim 1, further comprising logic for controlling a flow of the set of data tokens through the cores such that each data token is transferred from a first core to a second core upon a synchronous assertion of a request signal from the second core to the first core, and of a ready signal from the first core to the second core.

3. The system of claim 1, wherein an interface of a core includes a content specification flag for indicating whether a token containing the flag is a data token or a context identification token.

4. The system of claim 1, wherein an interface of a core includes a dedicated context identification field for transferring a current context identification token with each data token passing through the interface.

5. A context-flow data processing system, comprising a plurality of cores including:
   a) logic for controlling a flow of context identification tokens through the cores;
   b) a plurality of distributed multi-context storage units, each multi-context storage unit including:
      a context identification register for storing a context identification token identifying a current context of said each multi-context storage unit; and
      a multi-context register bank for storing a plurality of context parameters corresponding to a plurality of contexts,
      wherein the context identification register is connected to the multi-context register bank for setting the multi-context register bank to the current context; and
   c) logic for processing data tokens according to a context parameter corresponding to the current context.

6. A context-flow data processing system comprising a plurality of cores, each of the cores including:
   a) a context identification storage unit for storing a current context identification token, the current context identification token identifying a current context state selected from a plurality of context states stored in said each of the cores; and
   b) logic for controlling a flow of the current context identification token through the cores such that the current context identification token is transferred from a first core to a second core upon a synchronous assertion of a request signal from the second core to the first core, and of a ready signal from the first core to the second core.

7. A context-flow processing method comprising the steps of:
   a) propagating a current context identification token through a plurality of cores integrated on a chip, the current context identification token identifying a current context;
   b) retrieving a set of context parameters corresponding to the current context from each of a plurality of multi-context storage units distributed through the cores, as the current context identification token propagates through the multi-context storage units; and
   c) processing a set of data in the current context, according to the set of context parameters.

8. A context-flow data processing system comprising a first context-flow core and a second context-flow core integrated on a chip, the first core comprising:
   a) an input interface for receiving a context identification token from the second core, the context identification token identifying one of a plurality of contexts as a current context;
   b) a context identification register connected to the input interface, for storing the context identification token;
   c) a multi-context storage unit connected to the context identification register, for storing a plurality of context parameters corresponding to the plurality of contexts;
   d) control and processing logic connected to the context identification register and the context register bank, for processing data according to a set of context parameters for the current context.

9. A context-flow data processing system comprising a plurality of cores, each of the cores comprising:
   a) an input control bus for transferring input control signals;
   b) an input token bus for receiving input tokens in response to assertions of the input control signals, the input tokens including
      an input data token to be processed by the core, and
      an input context identification token specifying a current context, the input context identification token identifying a current context state selected from a plurality of context states stored in said each of the cores;
   c) an output control bus for transferring output control signals; and
   d) an output token bus for sending output tokens in response to assertions of the output control signals, the output tokens including
      an output data token derived from the input data token, and
      an output context identification token specifying the current context.

10. A multithreaded data processing system comprising a first core, a second core, and a third core integrated on a chip, the first core comprising:
   a multi-context storage unit storing a plurality of context states for a corresponding plurality of context;
   a first input interface connected to the second core, comprising
      a first input request connection for asserting a first input request signal to the second core,
      a first input ready connection for receiving a first input ready signal asserted by the second core, and
      a first input data connection for receiving from the second core a first input context token for establishing a current context state for the first core, the current context state being selected from the plurality of context states;
   processing logic connected to the first input interface, and to the multi-context storage unit, for processing a data token according to the current context state;
   a first output interface connected to the third core, comprising
      a first output request connection for receiving a first output request signal asserted by the third core,
      a first output ready connection for asserting a first output ready signal to the third core, and
      a first output data connection connected to the processing logic, for transmitting to the third core a first output context token derived from the first input context token, for establishing the context state for the third core;
   first input control logic connected to the first input interface, for controlling the first core to receive the first input context token if the first input request signal and the first input ready signal are asserted with a predetermined synchronous relationship; and first output control logic connected to the first output interface, for controlling the first core to transmit the first output context token to the third core if the first output request signal and the first output ready signal are asserted with a predetermined synchronous relationship.

11. The system of claim 10 wherein:
a) the first input control logic comprises logic for controlling the first core to receive the first input context token if the first input request signal and the first input ready signal are asserted synchronously; and
b) the first output control logic comprises logic for controlling the first core to transmit the first output context token to the third core if the first output request signal and the first output ready signal are asserted synchronously.

12. The system of claim 11 wherein:
a) the first input control logic comprises logic for controlling the first core to receive the first input context token synchronously with the first input request signal and the input ready signal; and
b) the first output control logic comprises logic for controlling the first core to transmit the first output context token synchronously with the first output request signal and the output ready signal.

13. The system of claim 10 wherein:
a) the first core further comprises a second output interface connected to a fourth core integrated on the chip, the second output interface comprising
a second output request connection for receiving a second output request signal asserted by the fourth core,
a second output ready connection for asserting a second output ready signal to the fourth core, and
a second output data connection connected to the data processing logic, for transmitting the first output context token to the fourth core; and
b) the first core further comprises second output control logic connected to the second output interface, for controlling the first core to transmit the first output context token to the fourth core if the second output request signal and the second output ready signal are asserted synchronously.

14. The system of claim 10 wherein the multi-context storage unit comprises:
a) a plurality of registers connected in parallel, for storing a plurality of context parameter values for a corresponding plurality of contexts; and
b) a multiplexer connected to the outputs of the plurality of registers, for selecting for transmission a value of the context parameter corresponding to a current context state for the multi-context storage unit.

15. A multithreaded data processing system comprising a first core and a second core, the first core comprising an input interface connected to the second core, the input interface including:
a) an input request connection for asserting an input request signal to the second core;
b) an input ready connection for receiving an input ready signal asserted by the second core; and
c) an input data connection for receiving from the second core an input context identification token identifying a current context state selected from a plurality of context states in the first core.

16. A multithreaded data processing system comprising a first core, a second core, and a third core integrated on a chip, the first core comprising:

a) an input interface connected to the second core, comprising
a control bus for transmitting a set of first control signals between the first core and the second core, and
an input data bus for receiving from the second core, upon the assertion of the set of first control signals according to a predetermined protocol an input data token, and
an input context identification token for establishing a current context state in the first core, the current context state being selected from a plurality of context states stored in the first core;
b) processing logic connected to the input interface, for generating an output data token from the input data token according to the current context state; and
c) an output interface connected to the third core, comprising
an output control bus for transmitting a set of second control signals between the first core and the third core, and
an output data bus connected to the processing logic, for transmitting to the third core, upon the assertion of the set of first control signals according to the predetermined protocol the output data token, and
an output context identification token derived from the first input context identification token.

17. A context-flow data processing method comprising the steps of:
a) establishing a first core and a second core, the second core being connected to the first core for receiving data tokens and context identification tokens from the first core, each context identification token identifying a context state selected from a plurality of context states stored in the second core cores; and
b) operating the first core in a first context, and concurrently, operating the second core in a second context different from the first context.

18. A context-flow processing method comprising the steps of:
a) establishing a core comprising a plurality of interconnected pipestages, the pipestages including
logic for controlling a flow of data tokens and context identification tokens therethrough, and
a plurality of distributed multi-context storage units each storing a plurality of context parameters and each responsive to the context identification tokens; and
b) operating a first set of pipestages in a first context specified by a first context identification token present within the first set of pipestages, and concurrently, operating a second set of pipestages in a second context specified by a second context identification token present within the second set of pipestages.

19. The data processing system of claim 5, wherein each of the plurality of cores is a data-driven core.

20. The data processing system of claim 6, wherein each of the plurality of cores is a data-driven core.

21. The data processing method of claim 7, wherein each of the plurality of cores is a data-driven core.

22. The data processing system of claim 8, wherein the first core and the second core are data-driven cores.

23. The data processing system of claim 8, wherein each token transfer between the second core and the first core occurs upon a synchronous assertion of a request signal from the first core to the second core and a ready signal from second core to the first core.

24. The data processing system of claim 10, wherein the first core, second core and third core are data-driven cores.

25. The data processing system of claim 15, wherein the first core and the second core are data-driven cores.

26. The data processing system of claim 16, wherein the first core, second core and third core are data-driven cores.

27. The data processing method of claim 17, wherein the first core and the second core are data-driven cores.

28. The data processing method of claim 18, wherein the core is a data-driven core.

29. A multi-context storage unit for storing a plurality of context parameters corresponding to a plurality of contexts, the multi-context storage unit comprising:

a context register bank comprising a plurality of context parameter registers for storing the plurality of context parameters, each context parameter register storing a parameter for one of the contexts, the plurality of context parameter registers having a corresponding plurality of inputs connected to an input connection, and a corresponding plurality of outputs; and a multiplexer having a plurality of multiplexer inputs each connected to a corresponding one of the plurality of context parameter register outputs, for selecting a current context parameter set for transmission to a multiplexer output; and a context identification register connected to the context register bank, for storing a current context identification token identifying a current context for the context register bank, wherein the context identification register is connected to a select line of the multiplexer, for controlling the multiplexer to select the current context parameter set for transmission; and the context identification register is connected to a load enable line of each of the context parameter registers, for enabling an updating of a current context parameter set in a corresponding context parameter register.

\* \* \* \* \*